United States Patent
Greulich

(10) Patent No.: US 6,677,761 B1
(45) Date of Patent: Jan. 13, 2004

(54) WIRE INSULATION DEFECT DETECTOR

(75) Inventor: Owen R. Greulich, Redwood City, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/023,276

(22) Filed: Dec. 12, 2001

(51) Int. Cl.[7] ............................ G01R 31/11; G01R 31/08
(52) U.S. Cl. ........................ 324/533; 324/534; 324/536
(58) Field of Search ................................ 324/512, 527, 324/533, 532, 536, 534, 514, 535

(56) References Cited

U.S. PATENT DOCUMENTS

| | | | |
|---|---|---|---|
| 3,728,620 A | 4/1973 | Heins | 324/52 |
| 3,781,665 A | 12/1973 | Gale | 324/52 |
| 3,970,924 A | 7/1976 | Pendleton et al. | 324/54 |
| 3,991,364 A | 11/1976 | Wizerowicz | 324/52 |
| 4,074,187 A | 2/1978 | Miller et al. | 324/51 |
| 4,291,204 A | 9/1981 | Crick | 179/175 |
| 4,891,597 A * | 1/1990 | Asars | 324/557 |
| 5,083,086 A * | 1/1992 | Steiner | 324/533 |
| 5,600,248 A * | 2/1997 | Westrom et al. | 324/522 |
| 5,760,590 A * | 6/1998 | Striffler | 324/514 |
| 6,161,077 A | 12/2000 | Fawcett | 702/58 |
| 2002/0130668 A1 * | 9/2002 | Blades | 324/536 |

OTHER PUBLICATIONS

David H. Johnson, Wiring System Diagnostic Techniques for Legacy Aircraft.*

* cited by examiner

Primary Examiner—N. Le
Assistant Examiner—Donald M Lair
(74) Attorney, Agent, or Firm—Robert M. Padilla; John F. Schipper

(57) ABSTRACT

Wiring defects are located by detecting a reflected signal that is developed when an arc occurs through the defect to a nearby ground. The time between the generation of the signal and the return of the reflected signal provides an indication of the distance of the arc (and therefore the defect) from the signal source. To ensure arcing, a signal is repeated at gradually increasing voltages while the wire being tested and a nearby ground are immersed in a conductive medium. In order to ensure that the arcing occurs at an identifiable time, the signal whose reflection is to be detected is always made to reach the highest potential yet seen by the system.

15 Claims, 3 Drawing Sheets

WIRE INSULATION DEFECT DETECTOR

ORIGIN OF THE INVENTION

The invention described herein was made by an employee of the United States Government and may be manufactured and used by or for the Government for governmental purposes without payment of any royalties thereon or therefore.

BACKGROUND OF THE INVENTION

1. Technical Field of the Invention

The present invention relates to wiring inspection techniques, and more specifically, it relates to techniques for identifying and determining the location of wiring insulation defects.

2. Description of the Prior Art

The presence of insulation defects in electrical wiring used in the Space Shuttle poses serious risks. Similar problems exist in all aircraft, as well as in industrial and other facilities. It is extremely difficult to identify cracked insulation even when it is exposed, and nearly impossible to detect it if it is not visually accessible.

Prior art technology for detecting insulation defects includes the use of Dielectric Withstand Voltage (DWV), the use of conductive media surrounding the wire, and the use of Time Domain Reflectometry (TDR).

DWV uses a relatively high electric potential to cause arcing to a surrounding component at ground potential. The discharge can then be detected to identify whether a particular conductor has a breach in the insulation. DWV does not have the ability to locate a defect in wire insulation, and if there is not a component at ground potential within approximately 0.010" (~254 $\mu$m) of the conductor, DWV used at normal voltages is not effective even for identifying the existence of an insulation defect. Higher voltages cannot be used for fear of harming undamaged insulation.

Because the arcing potential in atmosphere does not extend far enough to detect defects unless there is something at ground potential very near the insulation defect, a conductive medium (liquid or gas) can be used to enhance the conduction of the electricity from the wire to ground. Use of such a conductive medium enhances the capability of DWV to detect the existence of an insulation defect, but still does not locate it.

TDR uses a step or pulse of electricity, which reflects from changes in impedance in the wire, to measure the distance from that change. TDR is typically operated at low voltage (less than 25 volts, and usually less than 5 volts), and has essentially zero potential to arc in a normal atmosphere.

The use of TDR superposed on a direct current (DC) potential has been proposed as a means of increasing the distance to which TDR will arc, but even so, the arcing distance is limited to approximately 0.010" (~254 $\mu$m), since the DC potential will be limited to the same range noted for DWV, for the same reason. Further, a means of ensuring that arcing occurs on the TDR signal rather than on the DC current is required.

It is therefore desirable to provide a reliable technology for the detection and location of defects in the insulation of wire, and short and open circuits

SUMMARY OF THE INVENTION

It is an object of the present invention to provide a method and apparatus that enables remote detection and localization of short and open circuits and of very small defects in the insulation of wires, some of which heretofore required manual inspection and local access.

It is another object to combine a technique for avoiding premature arcing with Time Domain Reflectometry (TDR), Dielectric Withstand Voltage (DWV) and the use of conductive medium to remotely detect and locate wire insulation defects and short and open circuits.

These and other objects will be apparent to those skilled in the art based on the disclosure herein.

The invention remotely detects and locates very small breaches in wire insulation. The proposed innovation was inspired by the need to inspect shuttle wiring. Anticipated uses of the present invention include inspection of wiring in the space shuttle, in military and civilian aircraft and industrial plants. By combining several existing technologies (TDR, DWV and in some cases, the use of a conductive medium, none of which alone can achieve the stated goal) with an innovative concept for avoiding premature arcing, this new technique will overcome the limitations of each of the current individual technologies.

TDR makes use of the fact that a portion of a pulse or step function is reflected from a change in impedance in a conductor. The characteristic velocity of the conductor and the time for the reflection to return are used to calculate location.

DWV applies a predetermined voltage, usually DC, to a conductor, and notes if there is any arcing to a ground. It is limited by the fact that the usual voltage, about 1500V, is only enough to arc about 0.009" (~229 $\mu$m).

Incidents in the Shuttle Program and in the aviation community have resulted in a heightened interest in the possible aging of aerospace vehicle wiring and the potential consequences of this aging on safety.

Current technology does not permit remote detection and localization of small insulation defects, yet these defects can trigger catastrophic problems. For example, the wiring anomalies that triggered the incident on STS-93 very likely could not have been detected by any technique other than a visual or physical examination of the wire in question. The present invention would have allowed detection of breaches in the insulation of the same size as the one that caused this incident.

A significant development in the field, the invention achieves a goal that has been sought after by many organizations. The FAA, the Navy and the Air Force have all been funding research toward the goal of identifying and locating insulation defects. Thus far, none of the published research efforts known to the present inventor has resulted in a technique that is successful in non-destructively locating all insulation defects with breached insulation. The present development provides the ability to locate such defects. Various means may be used to provide such a ground if it is not otherwise available.

DETAILED DESCRIPTION OF THE INVENTION

Figure 1:
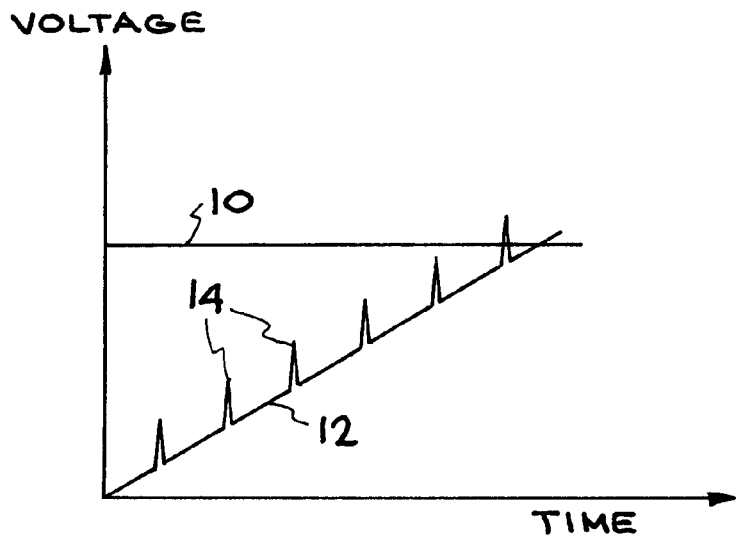
FIG. 1 illustrates one technique that utilizes a ramped DC voltage with superposed pulses.

The invention detects and locates wiring defects by detecting a reflected signal that is developed when an arc occurs through the defect to a nearby ground. The time between the generation of the signal and the return of the reflected signal provides an indication of the distance of the arc (and therefore the defect) from the signal source.

In order to ensure arcing, the signal is repeated at gradually increasing voltages while the wire being tested and a nearby ground are immersed in a conductive medium (gas or liquid). In order to ensure that the arcing occurs at an identifiable time (avoiding somewhat random arcing which might otherwise occur, and thus allowing the defect to be located as a function of the travel time of the signal), the signal whose reflection is to be detected is always made to reach the highest potential yet seen by the system.

This is accomplished by repeating a signal of increasing peak voltage, separated by time intervals sufficient to allow the return of the signal if it is reflected. The signal can be a pulse superimposed on a ramped or otherwise varying DC potential, a series of steps, a series of pulses of increasing magnitude, or a signal of varied shape or waveform.

The currently available reflection technique alone (Time Domain Reflectometry) would not work because the voltage is not high enough to arc far enough to be effective. In the present invention, this potential arc length is increased by increasing the voltage potential of the signal and by using a conductive atmosphere. If a superposed DC potential is used as a means of permitting a small pulse or step while achieving a relatively high total potential, the DC voltage is ramped or otherwise varied in order to ensure that the arcing does not occur before the pulse reaches the defect.

This technique utilizes hardware to create the signal and to filter the returned signal. It can use feature identification software to simplify the results (e.g., provide a simple statement such as "Breached insulation at 5.43 m", or "Short at 24.65 m"). It can also be used with multiplexing equipment to test many conductors in very fast sequence, probably requiring some modifications to that equipment to permit signal passage without excessive interference or attenuation.

This invention embodies a combination of technologies not heretofore used in conjunction with each other. By combining these technologies, along with the unique approach of varying the superposed DC voltage, it is possible to overcome the weaknesses of the individual technologies. That is: TDR (the timed step or pulse technique) allows location of features that it can identify, but the low voltages used do not permit arcing to occur, and so the features to be identified are limited. DWV (the technique of using a relatively high DC voltage so as to permit arcing) does not permit location of defects.

The voltage to which DWV must be limited in order to avoid damaging the wire is still not high enough to permit identification of defects if there is not a conductive ground located very close to the conductor.

The superposition of TDR on conventional DWV might possibly locate a defect, but the odds are very much against it because if arcing does occur, it is likely to occur when the DWV voltage is applied, and before the TDR pulse is applied.

Combining TDR and DWV enhances the arcing capability of the TDR, and adding the conductive medium enhances it further (permitting arcing over distances of fractions of an inch or more, as opposed to thousandths of an inch). The use of the ramped or otherwise DC superposed voltage ensures that the first time that an arcing potential is reached will be when the TDR pulse is applied. This permits the localization of insulation defects which were previously not able to be localized without direct access to the wire.

FIG. 1 illustrates one technique that utilizes a ramped DC voltage with superposed pulses. The horizontal line 10 is the arcing threshold. It can be seen that the ramped DC voltage 12 increases in voltage magnitude with time and that the peak of each superposed pulse 14 has a voltage magnitude that is greater than the voltage magnitude of the base of the next pulse. As discussed above, setting the peak of each pulse to be higher than the base of the following pulse ensures that the first time that an arcing potential is reached will be when the TDR pulse is applied rather than when the DC level exceeds the arcing threshold. The time that the arc occurs can be very precisely determined because the time position of each superposed pulse is known.

Figure 2:
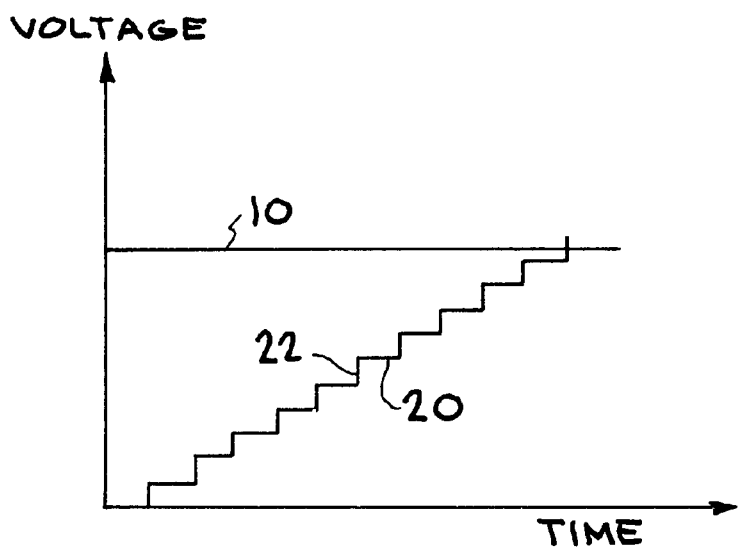
FIG. 2 illustrates the use of a step function with a DC plateau and a rising edge.

FIG. 2 illustrates the use of a step function with a DC plateau 20 and a rising edge 22. Using this function, the arcing event will only occur on the rising edge. As in the embodiment of FIG. 1, the precisely known time position of each rising edge allows the distance to the insulation defect to be calculated.

Figure 3:
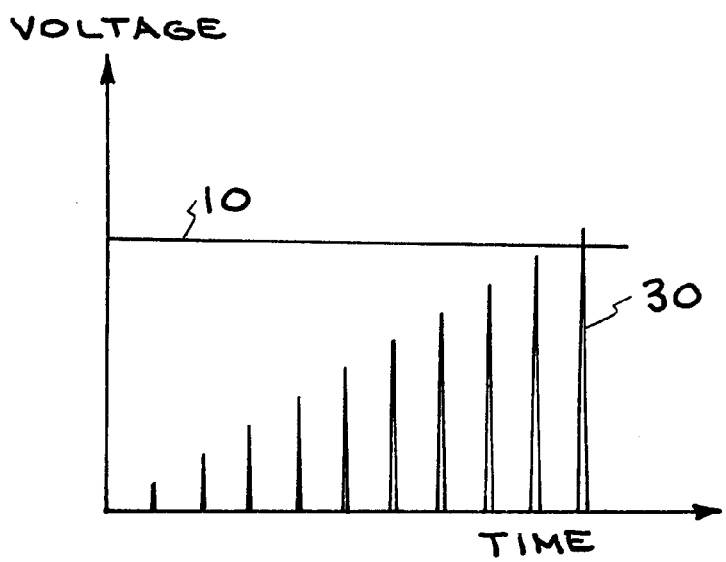
FIG. 3 shows still another exemplary alternate waveform having a progressively increasing pulse magnitude without the ramped DC voltage provided in the embodiments of FIGS. 1 and 2.

FIG. 3 shows still another alternate waveform 30 having a progressively increasing pulse magnitude without the ramped DC voltage provided in the embodiments of FIGS. 1 and 2. As will be appreciated by those skilled in the art, other waveforms are usable in the present invention.

This innovation has applications in aerospace (in particular, on the Shuttle) and in aircraft wiring, both commercial and military. It may be used in industrial plants and facilities, and for testing of underground wiring and telecommunications cables. Wherever access to wiring is limited, wiring integrity is critical, a ground is available, and cost of access or replacement is high, this innovation has the potential to be used.

Thus, this innovation will permit greatly increased inspection of wire because of significantly reduced cost, labor and intrusiveness of the process.

This equipment will interface with, and in some cases replace equipment, made by a wide variety of companies.

Description of the Enhanced TDR Unit with Superimposed DWV Capability and Filtering The practical effect of an enhanced TDR unit with superposed DWV capability is to provide a TDR unit with pulses at a much higher voltage than exists on conventional TDR units available from manufacturers such as Agilent (formerly HP), Tektronix, etc. There are three basic approaches to accomplishing this:

1. A TDR unit that has high voltage capability, and which steps up incrementally in voltage.

2. A TDR unit that superposes its voltage on top of a DC potential, where ground for the TDR unit essentially floats at the DC potential.

3. A TDR unit that superposes its voltage on top of the DC potential by coupling it in parallel, for example through a capacitor or a diode. Such a capacitor or diode would be transparent in the direction from the TDR unit to the wiring to be tested, but would effectively be an insulator in the reverse direction (against the DC potential).

Example 1 of the Use of this Invention

This first example explains the procedure and equipment used for inspection of the wiring of the experimental X-36 Tailless Agility Research Aircraft for wiring defects, including short circuits, open circuits, and very small breaks in the insulation which are not yet shorted.

Equipment

1. Preferably, an enhanced TDR unit with superimposed DWV capability and filtering.

2. A multiplexing unit. (Note: This is not required, but it provides the maximum efficiency to the operation by automatically switching between conductors within the wiring harness.)

3. Connection cables to the aircraft wiring harness (adapter cable with connector matching the multiplexing unit at one end, connector matching the wiring harness at the other end).

4. Conductive medium. (For maximum sensitivity while keeping circuits dry, use neon. Neon is chosen because grounding is to the metallic components in the aircraft, and these are not always extremely close to the wiring harness, and so the greatest arcing potential is required.)

5. Containment system for the conductive medium. (In this case, use the shell of the aircraft itself as the confinement system.)

Procedure

1. Connect the Enhanced TDR unit to the input side of the Multiplexing Unit.

2. Disconnect both ends of the wiring harness to be tested.

3. Connect the output side of the Multiplexing unit to the wiring harness using the connection cable.

4. Fill the body of the aircraft with helium. Because this is a very small aircraft, it is not only feasible but also desirable to use the body of the aircraft as the containment system for the neon. It is feasible because there is a relatively small volume to fill. It is desirable because by using the aircraft as system ground, the need to get into small spaces with a separate containment system and ground is eliminated.

5. Implement the inspection, sending a step function through each conductor in the wiring harness sequentially.

6. The signal returned through the Enhanced TDR unit will accomplish the following:

identify the length of the conductor if it has no defects, based on the time required for the signal to reflect back from the end of the conductor; and identify the distance to any short circuit, open circuit, or break in the insulation, and provide information as to the type of the defect. If the defect is a short, the signal returned from the first step in voltage sent by the system will identify it as in conventional TDR inspection. If the defect is an open circuit, the signal returned will provide the distance to the open circuit, with a characteristic signature. If the defect is a break in the insulation, the distance to the break will be provided, and the signature will differ from that for an open circuit because it will occur at a different step level and have a different characteristic signature.

Example 2 of the Use of this Invention

This example illustrates the inspection of selected wiring (conductors) of an F-16 for wiring defects, including short circuits, open circuits, and very small breaks in the insulation which are not yet shorted.

Equipment

1. Preferably, an enhanced TDR unit with superimposed DWV capability and filtering.

2. Interface cable to the aircraft wiring harness (adapter cable with connector matching the TDR unit at one end, ground clip and wiring clip to the wiring harness at the other)

3. Conductive medium (Helium is chosen because grounding is to the metallic components in the aircraft, however it is recognized that some defects in this system, if far enough from the structure of the aircraft, may not be critical.)

4. Containment system for the conductive medium. In this case, two approaches will be used, depending on accessibility. Where access is limited, sections of the aircraft will be isolated using polyethylene or other flexible sheet material, then filled with helium. Where access is greater and wire bundles are small and close to metal structure, confinement of the gas can be managed with aluminum foil (or a similar flexible conductive material) wrapped around or pressed against the wiring harness and grounded to the aircraft shell.

Procedure

1. Disconnect both ends of the wiring harness to be tested.

2. Connect the interface cable to the TDR unit.

3. Connect the clips on the interface cable to the ground and to the conductor to be tested.

4. Fill the confined areas of the aircraft with helium and inject helium into the areas where the wiring harness is wrapped for gas confinement.

5. Implement the inspection, sending a step function through the conductor.

6. The signal returned through the Enhanced TDR unit will accomplish the following:

identify the length of the conductor if it has no defects, based on the time required for the signal to reflect back from the end of the conductor; and identify the distance to any short circuit, open circuit, or break in the insulation, and provide information as to the type of the defect. If the defect is a short, the signal returned from the first step in voltage sent by the system will identify it as in conventional TDR inspection. If the defect is an open circuit, the signal returned will provide the distance to the open circuit, with a characteristic signature. If the defect is a break in the insulation, the distance to the break will be provided, and the signature will differ from that for an open circuit because it will occur at a different step level and have a different characteristic signature.

Example 3 of the Use of this Invention

This example is directed to the inspection of selected wiring (conductors) in a boat or ship for wiring defects, including short circuits, open circuits, and very small breaks in the insulation which are not yet shorted.

Equipment Required

1. Preferably, an enhanced TDR unit with superimposed DWV capability and filtering.

2. Interface cable to the aircraft wiring harness (adapter cable with connector matching the TDR unit at one end, ground clip and wiring clip to the wiring harness at the other).

3. Conductive medium. (Deionized water with 20 ppm of salt.)

4. Containment system for the conductive medium. In this case the requirements for the containment system are minimal. The water is applied to the wiring harness and it is made certain that the ground wire from the TDR unit contacts the water. Moisture in the local area can be maintained by use of wet clothes and/or foil or plastic sheeting. Metal foil has the advantage of improved conduction and a place to connect the grounding clip.

Procedure

1. Disconnect both ends of the wiring harness to be tested.

2. Connect the interface cable to the TDR unit.

3. Connect the clips on the interface cable to the ground and to the conductor to be tested.

4. Apply the water to the section of wiring to be tested.

5. Implement the inspection, sending a step function through the conductor.

6. The signal returned through the Enhanced TDR unit will accomplish the following:

identify the length of the conductor if it has no defects, based on the time required for the signal to reflect back from the end of the conductor; and identify the distance to any short circuit, open circuit, or break in the insulation, and provide information as to the type of the defect. If the defect is a short, the signal returned from the first step in voltage sent by the system will identify it as in conventional TDR inspection. If the defect is an open circuit, the signal returned will provide the distance to the open circuit, with a characteristic signature. If the defect is an open circuit, the signal returned will provide the distance to the open circuit, with one of two characteristic signatures. If the defect is a break in the insulation, the distance to the break will be provided, and the signature will differ from that for either an open circuit or a short circuit because it will occur at a different step level and it will reflect the characteristics of an arc.

Figure 4:
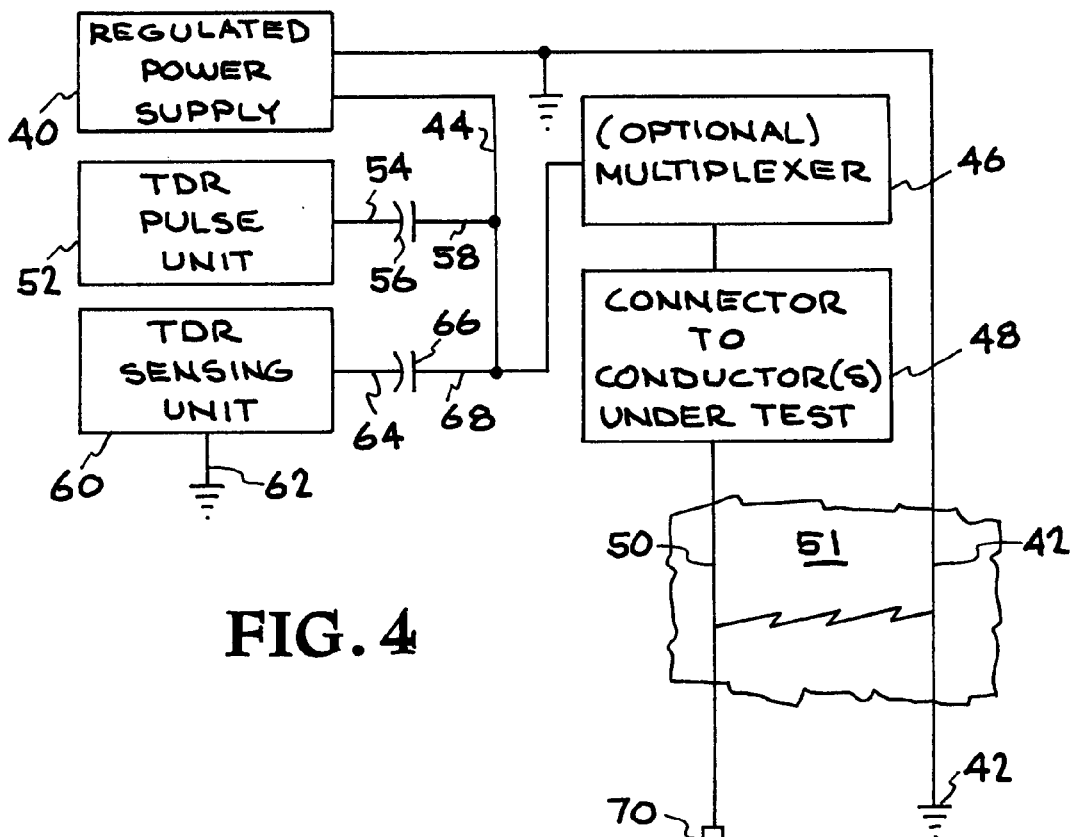
FIG. 4 is a block diagram showing an embodiment of the invention where the regulated power supply, TDR pulse unit and the TDR sensing unit are all capacitively coupled together.
Figure 5:
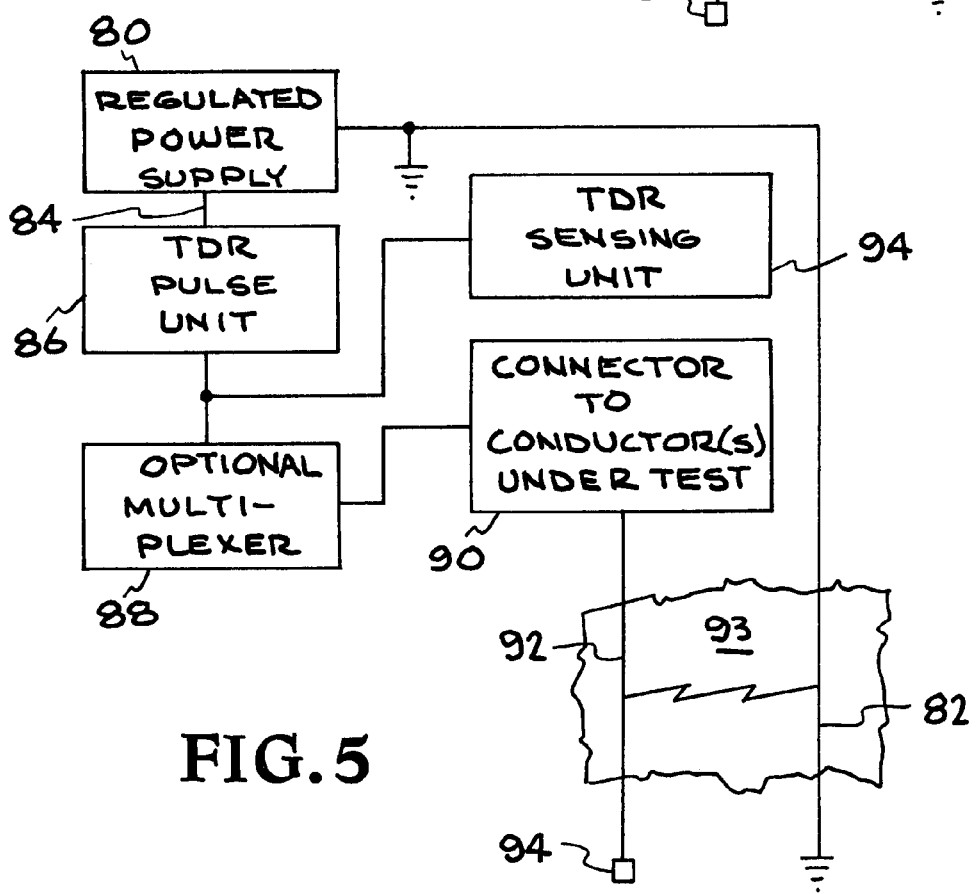
FIG. 5 is a block diagram showing an embodiment of the invention where the regulated power supply is coupled in series with the TDR pulse unit, which is coupled in parallel to the TDR sensing unit.
Figure 6:
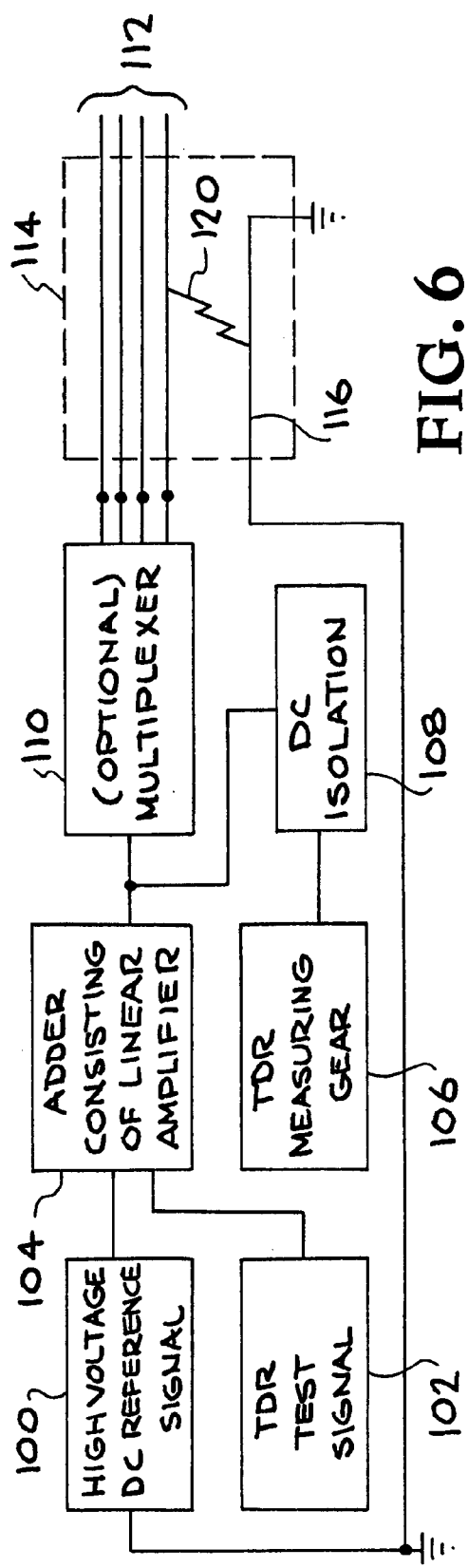
FIG. 6 is a block diagram of another embodiment test set up that combines a high voltage DC reference signal and a TDR test signal in a linear amplifier.

Exemplary schematics of embodiments of the test set up for performing the tests shown in the above examples 1–3 are shown in FIGS. 4–6. However the use of these exemplary schematics is not limited to the above examples as will be apparent to those skilled in the art based on the teachings herein.

In the exemplary schematic of one embodiment of the test set up as shown in FIG. 4, regulated power supply 40 is connected to aircraft ground 42. Line 44 from regulated power supply 40 is optionally connected to a multiplexer 46 and then to a connector 48 for connection to a conductor 50 under test. Alternately, the regulated power supply 40 may be directly connected to the connector 48. TDR pulse unit 52 is connected to cable 44 through cable 54, capacitor 56 and cable 58. TDR sensing unit 60 is grounded at 62 and connected to cable 44 through cable 64, capacitor 66 and cable 68. Cable 50 under test is open at its distal end 70. A conductive medium 51 is confined around the conductor 50 under test and the ground 42.

Another exemplary schematic of one embodiment of the test set up is shown in FIG. 5. Regulated power supply 80 is connected to aircraft ground 82. Line 84 from regulated power supply 80 is connected to TDR pulse unit 86, which is optionally connected to an multiplexer 88 and then to a connector 90 for connection to a conductor 92 under test. TDR sensing unit 94 is connected between TDR pulse unit 86 and multiplexer 88 or alternately, between connector 90 and TDR pulse unit 86 when multiplexer 88 is not included. Conductor 92 under test is open at its distal end 94. A conductive medium 93 is made to surround both the conductor 92 under test and the ground 82.

Figure 7:
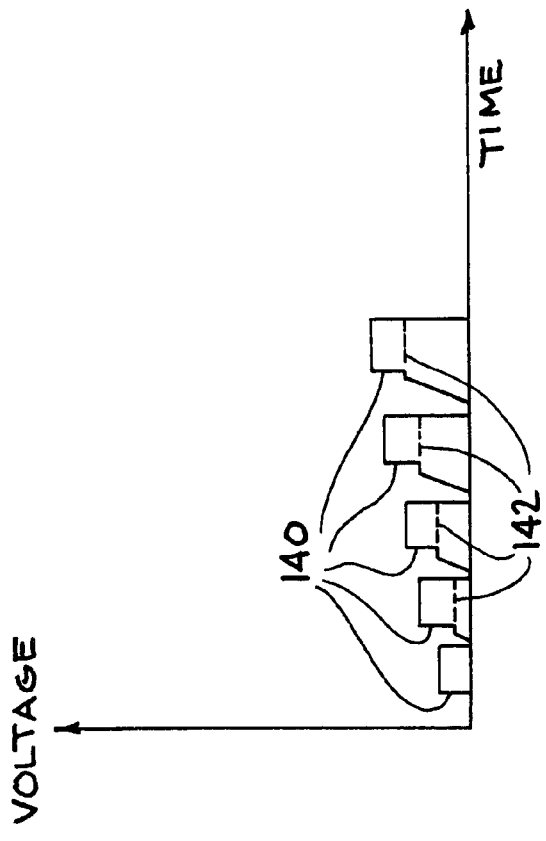
FIG. 7 shows a waveform that can be produced by the embodiment of FIG. 6.

Still another exemplary schematic of an embodiment test set up is shown in FIG. 6 where a high voltage DC reference signal 100 and a TDR test signal 102 are combined in an adder 104 consisting of a linear amplifier. TDR measuring equipment 106 is passed through a DC isolation circuit 108 and combined with the output from adder 104 and these combined signals may optionally be passed through a multiplexer 110 before connection to the test wires 112. A conductive medium 114 surrounds the test wires 112 such that an arc 120 between the test wires 122 and the ground 116 will occur at a sufficient voltage. A waveform that can be produced by the embodiment of FIG. 6 is shown in FIG. 7. The DC reference signal 142 is produce by a high voltage DC signal generator such as the one that provides the DC reference signal 100 of FIG. 6. TDR test signal 140 is produced by a TDR signal generator such as the one that provides the TDR test signal 102 of FIG. 6. The TDR signal 140 of FIG. 7 ideally has a sharp rate of rise. The rate of rise for the DC reference signal and the drop off rate of the combined DC reference signal and the TDR signal are not critical.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application. The scope of the invention is to be defined by the following claims.

I claim:

1. A method for detecting and locating a wire insulation defect, comprising:

sending a waveform down a wire under test, wherein said waveform is sent from a proximal end of said wire and comprises a series of progressively larger peaks of voltage which voltages are comprised of a plurality of voltage pulses superimposed on a varying ramped DC potential wherein the peak of each pulse of said plurality of pulses has a magnitude that is greater than the magnitude of the foot of the next voltage pulse, that includes an arc producing voltage peak that is larger than all previous voltage peaks, wherein an arc will pass through an insulation defect of said wire under test at said arc producing voltage, wherein a reflection of said arc producing voltage will propagate back toward said proximal end;

measuring the travel time of said arc producing voltage; and calculating the location of said defect from said travel time.

2. The method of claim 1, wherein each voltage increase of said series of progressively larger voltage increases is separated from all other voltage increases by a time interval sufficient to allow the travel time of said arc producing voltage increase to be measured before another voltage increase is generated.

3. The method of claim 1, wherein said waveform is produced by a source, wherein the step of measuring the travel time of said arc producing voltage comprises measuring the roundtrip travel time of said arc producing voltage increase from said source to said insulation defect and back to said source.

4. The method of claim 3, wherein the step of calculating the location of said defect comprises dividing said round trip travel time by 2 to provide the signal propagation travel time from said source to said defect and multiplying said signal propagation travel time by speed of said arc producing voltage increase within said wire to determine the distance of said defect from said source.

5. The method of claim 1, further comprising providing a conductive medium from said wire to said ground.

6. The method of claim 5, wherein said conductive medium comprises a conductive gas.

7. The method of claim 6, wherein said conductive gas is selected from the group consisting of helium, neon, argon, radon and krypton, and mixtures thereof.

8. The method of claim 5, wherein said conductive medium comprises a conductive liquid.

9. The method of claim 8, wherein said conductive liquid is selected from the group consisting of water, liquid polymers, liquid solutions and liquid suspensions.

10. The method of claim 1, said method further comprising: configuring said waveform such that a difference between said magnitude of said peak of each pulse and said magnitude of said foot of said next voltage pulse is monotonically increasing.

11. The method of claim 1, said method further comprising:
configuring said waveform such that a difference between said magnitude of said peak of each pulse and said magnitude of said foot of said next voltage pulse is monotonically decreasing.

12. The method of claim 1, said method further comprising:
configuring said waveform such that a difference between said magnitude of said peak of each pulse and said magnitude of said foot of said next voltage pulse is substantially the same.

13. A method for detecting and locating a wire insulation defect, comprising:

generating a plurality of voltage pulses with a voltage source such pulses superimposed on a varying ramped DC potential wherein the peak of each pulse of said plurality of pulses has a magnitude that is greater than the magnitude of the foot of the next voltage pulse, wherein each pulse of said voltage pulses has a voltage peak of a greater magnitude than all previous voltage pulses, wherein said each pulse is separated from all other pulses by a time interval sufficient to allow the return of said each pulse to said source before another pulse is generated by said source;

propagating said plurality of voltage pulses down a wire under test, wherein a pulse of said plurality of voltage pulses will arc through a wire insulation defect to a ground when said pulse reaches an arcing potential;

measuring the round trip travel time of said pulse from said source to said insulation defect back to said source; and calculating the location of said wire insulation defect from said travel time.

14. An apparatus for detecting and locating a wire insulation defect, comprising:

means for sending a waveform down a wire under test, wherein said waveform is sent from a proximal end of said wire and comprises a series of progressively larger peaks of voltage which voltages are comprised of a plurality of voltage pulses superimposed on a varying ramped DC potential wherein the peak of each pulse of said plurality of pulses has a magnitude that is greater than the magnitude of the foot of the next voltage pulse, that includes an arc producing voltage peak that is larger than all previous voltage peaks, wherein an arc will pass through an insulation defect of said wire under test at said arc producing voltage, wherein a reflection of said arc producing voltage will propagate back toward said proximal end;

means for measuring the travel time of said arc producing voltage; and means for calculating the location of said defect from said travel time.

15. The apparatus of claim 14, further comprising a multiplexer connected in parallel to said means for sending a waveform down a wire under test whereby said waveform on said wire under test can be multiplexed to additional test wires in a sequential manner.

* * * * *